United States Patent
Ferguson

(10) Patent No.: US 11,092,634 B2
(45) Date of Patent: Aug. 17, 2021

(54) CABLE NETWORK MODELLING

(71) Applicant: BRITISH TELECOMMUNICATIONS PUBLIC LIMITED COMPANY, London (GB)

(72) Inventor: Andrew Ferguson, London (GB)

(73) Assignee: BRITISH TELECOMMUNICATIONS public limited company, London (GB)

( * ) Notice: Subject to any disclaimer, the term of this patent is extended or adjusted under 35 U.S.C. 154(b) by 369 days.

(21) Appl. No.: 16/215,903

(22) Filed: Dec. 11, 2018

(65) Prior Publication Data

US 2019/0178925 A1     Jun. 13, 2019

(30) Foreign Application Priority Data

Dec. 12, 2017   (EP) .................................... 17206804

(51) Int. Cl.
    *G01R 27/26*          (2006.01)
    *G01R 27/16*          (2006.01)
                  (Continued)

(52) U.S. Cl.
    CPC ......... *G01R 27/2694* (2013.01); *G01R 27/16* (2013.01); *G01R 31/58* (2020.01); (Continued)

(58) Field of Classification Search
    CPC ........ G01R 27/00; G01R 27/02; G01R 27/16; G01R 27/26; G01R 27/2688; (Continued)

(56) References Cited

U.S. PATENT DOCUMENTS 7,295,018 B2 *   11/2007   Oakley .................. G01R 31/11
                                                 324/533
2015/0170030 A1    6/2015   Maennel
                     (Continued)

OTHER PUBLICATIONS

Ilker Yildirim, "Bayesian Inference: Gibbs Sampling", Department of Brain and Cognitive Sciences, University of Rochester, NY, Aug. 2012 (6 pgs.).

(Continued)

*Primary Examiner* — Hoai-An D. Nguyen
(74) *Attorney, Agent, or Firm* — Nixon & Vanderhye P.C.

(57) ABSTRACT

The invention generates a model of the composition of the cable segments in a network. Different cable compositions have different loss distributions. Each cable segment is given a starting cable composition (based on cable records if available), and thus can be represented as a loss distribution. The loss for each circuit can be measured (by measuring Hlog), and thus can also be represented as a loss distribution. Updates are made to the loss distribution for each segment so that the loss distributions that make up each circuit is consistent with that of the (measured) loss distribution for that circuit. These updates are preferably performed as Bayesian updates of each cable segment (loss distribution) using Gibbs sampling (i.e. the other cable segment loss probabilities are fixed whilst the probability for the segment under consideration is updated).

14 Claims, 8 Drawing Sheets

(51) Int. Cl.
*G01R 31/00* (2006.01)
*H04L 12/24* (2006.01)
*H04L 12/26* (2006.01)
*G01R 31/58* (2020.01)

(52) U.S. Cl.
CPC ............ *H04L 41/145* (2013.01); *H04L 41/16* (2013.01); *H04L 43/08* (2013.01); *G01R 31/00* (2013.01)

(58) Field of Classification Search
CPC .... G01R 27/2694; G01R 31/00; G01R 31/50; G01R 31/58; H04L 41/00; H04L 41/14; H04L 41/145; H04L 41/16
USPC ....... 324/600, 612, 613, 649, 659, 663, 671, 324/691, 713, 715, 717; 702/1, 22, 27
See application file for complete search history.

(56) References Cited

U.S. PATENT DOCUMENTS

2017/0180549 A1    6/2017  Zahedi et al.
2020/0086413 A1*   3/2020  Hoeller .................... G01B 7/10

OTHER PUBLICATIONS

Search Report for EP17206804.1, dated May 4, 2018, 9 pages.
Ferguson et al., "Cable Belief Networks (Best Application Paper)", ECCV 2016 Conference, Nov. 21, 2017, pp. 177-189.

* cited by examiner

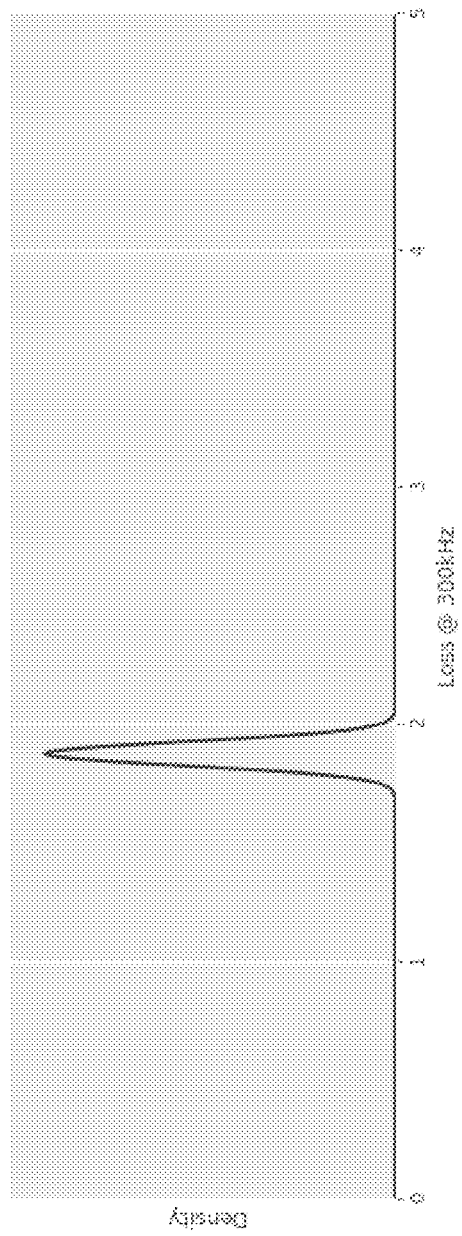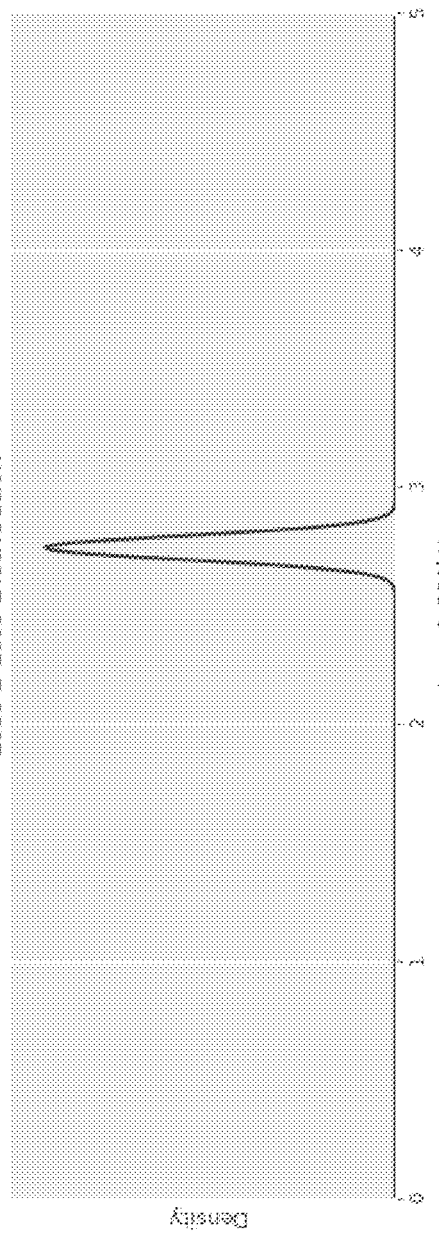

CABLE NETWORK MODELLING

This application claims priority to EP Patent Application No. 17206804.1 filed 12 Dec. 2017, the entire contents of which is hereby incorporated by reference.

FIELD OF THE INVENTION

This invention relates to a method of generating a model of the composition of cable segments in a telecommunications network.

BACKGROUND

Digital subscriber line (xDSL) services, commonly referred to as "broadband" services, are deployed using metallic PSTN lines that run between a digital subscriber line access multiplexer (DSLAM) and modems in customers' premises. With asymmetric DSL (ADSL) the DSLAM is located in the exchange and the line can be typically up to 7 km in length. With very-high bit-rate DSL (VDSL), the DSLAM is located in a local cabinet with the line being much shorter, typically a maximum of 2 km.

The line between the DSLAM and a customer's premises is typically made up of a twisted metallic pair of copper, or sometimes aluminium.

FIG. 1 shows an example of a broadband network 100, comprising a DSLAM 102, a PCP (Principle Connection Point) 104, and two customers' premises 106 and 108. In this example, the DSLAM 102 is located in an exchange and provides ADSL services to the premises 106 and 108. The line (herein referred to interchangeably as "circuit") from DSLAM 102 to a customer premises, such as premises 106, is comprised of multiple cable segments. Each cable segment is composed of multiple cable legs (one for each circuit), and thus each segment is shared between multiple circuits. Typically, the final cable segment is a drop wire, which is only used by one of the circuits.

In this example, the circuit for customer premises 106 is comprised of cable segments $C_1$ 110, $C_2$ 112, $C_3$ 114 and $D_2$ 118. The circuit for customer premises 108 is comprised of cable segments $C_1$ 110, $C_2$ 112 and $D_1$ 116.

The loss properties of a customer's circuit are a dominant factor in determining the speed of the broadband service that the customer can receive over that circuit. Specifically, the rate that a broadband connection can achieve is proportional to the length, material and gauge of the cables that make up the circuit. Therefore, knowing the composition of the cable segments is essential for estimating an expected rate of a connection.

As telephone cable networks have been built up over many years stretching back decades, the quality of existing inventory records that might have this cable information can be variable. One of the most common errors is that a cable segment is labelled as copper but is in fact aluminium. This is due to legacy issues with the digitisation of inventory records that has results in a proportion of the cable records being "generic" or "inferred" which meant that a default value of 0.5 gauge copper was used. Currently, the only way to confirm whether these records are correct is to physically inspect the cable segments.

The problem is magnified as broadband technology moves away from (longer reaching) exchange based technology such as ADSL, to (shorter reaching) FTTC technologies such as VDSL and now G.fast. With VDSL and G.fast, the rate that a customer can receive over such a service is more sensitive to the noise these errors can introduce as they form a larger proportion of the total circuit length.

SUMMARY OF THE INVENTION

According to one aspect of the present invention, there is provided a method of modelling the composition of cable segments in a network, said network comprising a plurality of circuits each connected to a respective customer premises, each circuit comprising at least one cable segment and at least one cable segment is shared between a plurality of circuits, said method comprising:
a) determining a loss measurement for each circuit;
b) setting a circuit loss distribution for each circuit in dependence on the loss measurement for the respective circuit;
c) setting a loss distribution for each cable segment to a respective initial loss distribution;
for a selected cable segment:
  d) estimating an observed loss of the selected cable segment by subtracting, from the circuit loss distribution of a circuit comprising the selected cable segment, the loss distributions of any other cable segments in said circuit;
  e) repeating step d) for other circuits comprising the selected cable segment to estimate further observed losses;
  f) determining an updated loss distribution for the selected cable segment in dependence on the observed loss estimates from steps d) and e), and setting the loss distribution for the selected cable segment to the updated loss distribution;
g) repeating step d) to f) for other selected cable segments; and
h) mapping the loss distributions for each cable segment onto respective cable composition probabilities.

Steps d) to f) may be performed using Gibbs sampling. Steps d) to g) can be repeated until a predetermined termination criteria is met.

The cable segments may be metallic, and the composition may comprise at least one of material, gauge or length.

The respective initial loss distributions may be based on an initial prediction of the cable segment composition. The initial prediction may be based on cable inventory records. Alternatively, or additionally, the initial prediction may be based on a weighted circuit loss distribution.

The loss distributions may be probability distributions of the loss.

The updated loss distribution for a cable segment may be dependent on the estimated observed loss distribution and the initial loss distribution of that cable segment.

According to a second embodiment of the invention, there is provided an estimation unit for modelling the composition of cable segments in a network, said network comprising a plurality of circuits each connected to a respective customer premises, each circuit comprising at least one cable segment and at least one cable segment is shared between a plurality of circuits, said estimation unit adapted to:
a) determine a loss measurement for each circuit;
b) set a circuit loss distribution for each circuit in dependence on the loss measurement for the respective circuit;
c) set a loss distribution for each cable segment to a respective initial loss distribution;
for a selected cable segment:
  d) estimate an observed loss of the selected cable segment by subtracting, from the circuit loss distribution of a circuit comprising the selected cable segment, the loss distributions of any other cable segments in said circuit;

e) repeat step d) for other circuits comprising the selected cable segment to estimate further observed losses;

f) determining an updated loss distribution for the selected cable segment in dependence on the observed loss estimates from steps d) and e), and setting the loss distribution for the selected cable segment to the updated loss distribution;

g) repeat step d) to f) for other selected cable segments; and h) map the loss distributions for each cable segment onto respective cable composition probabilities.

BRIEF DESCRIPTION OF THE DRAWINGS

For a better understanding of the present invention reference will now be made by way of example only to the accompanying drawings, in which:

FIGS. 5a and 5b shows initial circuit loss distributions;

DESCRIPTION OF PREFERRED EMBODIMENTS

The present invention is described herein with reference to particular examples. The invention is not, however, limited to such examples.

A circuit refers to the collection of cable segments that connect from a DSLAM to a customer's premises. Each cable segment has an associated cable composition (typically comprising length, gauge and material). An aim of the invention is to generate a model of the composition of all the cable segments. Some of the cable segments are shared by more than one circuit, with the cable composition within that segment being fixed i.e. composition does not vary between circuits using that segment. Different cable compositions have different loss distributions. Each cable segment is given a starting cable composition (based on cable records if available), and can thus be represented as a loss distribution. The loss for each circuit can be measured (by measuring H log), and thus can also be represented as a loss distribution. Updates are made to the loss distribution for each segment so that the loss distributions that make up each circuit is consistent with that of the (measured) loss distribution for that circuit. These updates are preferably performed as Bayesian updates of each cable segment (loss distribution) using Gibbs sampling (i.e. the other cable segment loss probabilities are fixed whilst the probability for the segment under consideration is updated).

Figure 1:
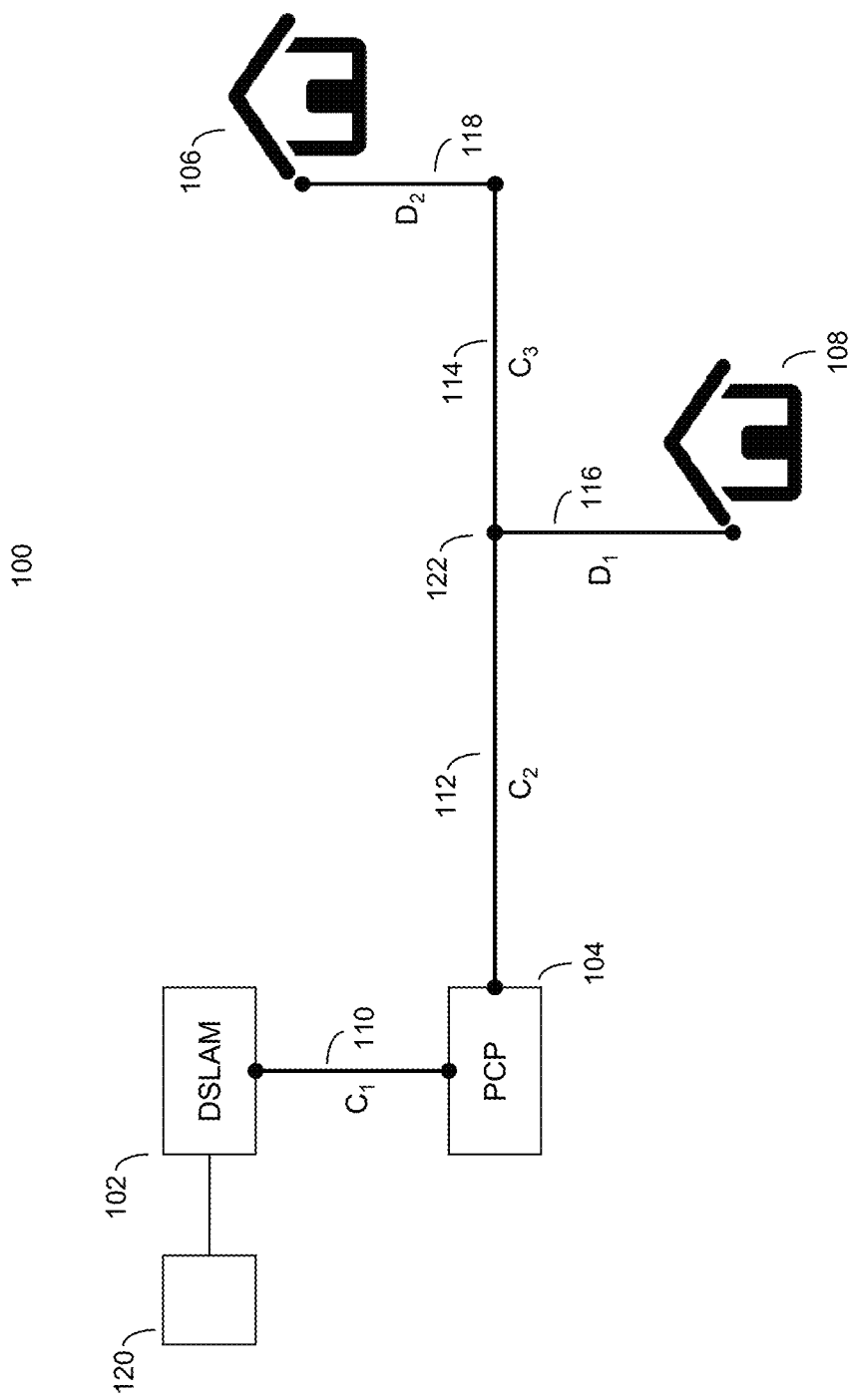
FIG. 1 is a simplified diagram showing a DSL network with cable segments.

FIG. 1 illustrates a simplified example of a digital subscriber line (DSL) network 100, with elements omitted for simplicity, as described earlier. There are 2 circuits in this example: a first circuit for customer premises 106 comprising cable segments $C_1$ 110, $C_2$ 112, $C_3$ 114 and $D_2$ 118; and a second circuit for customer premises 108 comprising cable segments $C_1$ 110, $C_2$ 112 and $D_1$ 116. Cable segments $D_1$ 116 and $D_2$ 118 are drop wires. Thus, cable segment $C_1$ 110 (running between the DSLAM 102 to the PCP 104) and cable segment $C_2$ (running between the PCP 104 and a junction box 122) are found in both circuits. However, cable segments $C_3$ 114 and $D_2$ 118 form only part of the first circuit, and cable segment $D_1$ 116 only part of the second circuit.

Each cable segment is a collection of twisted pairs of metallic wires. The composition of each of those wires should be the same as the other wires within a given cable segment. Examples of the invention aim to model the composition (typically length, gauge, and material) of these cable segments. For example, the composition of a segment might be (length=) 100 m of (gauge=) 0.5 mm (material) copper Cu, or 200 m of 0.7 mm aluminium Al.

Figure 2:
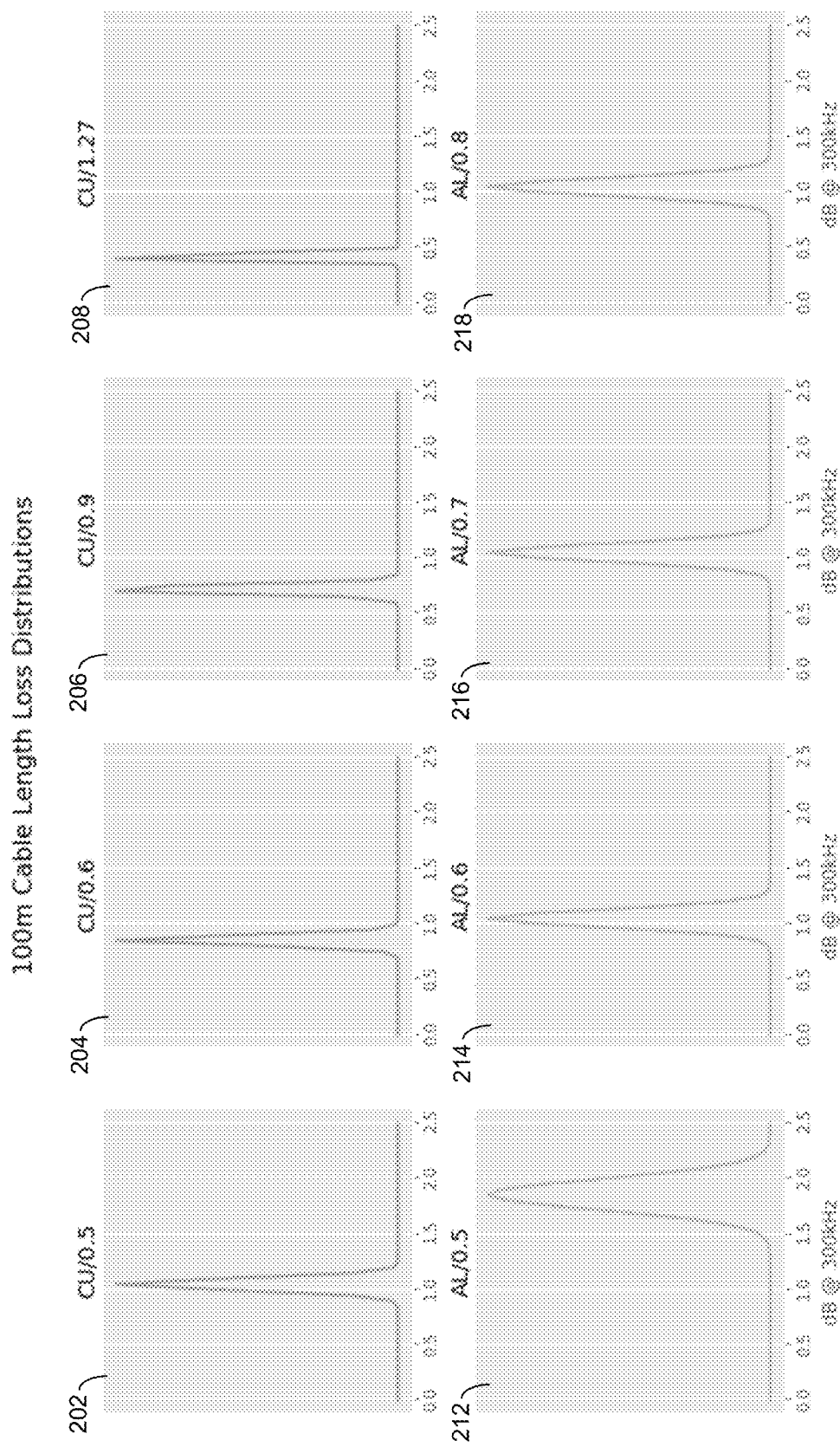
FIG. 2 shows some example loss distributions for different cable compositions.

Each cable segment has an associated signal loss (measured in dB), which is typically taken at 300 kHz (the loss will vary according to the frequency of the signal). This is often referred to as insertion loss. In practice, this loss does not take a single value for a given cable segment. Instead, due to twisting effects experienced by different pairs of wires, each cable segment will have an associated loss distribution that is dependent on the composition of that cable segment. The loss distributions are probability distributions representing the loss in dB measured at 300 kHz. FIG. 2 shows an example of some loss distributions for cable segments 100 m in length, and made of, 0.5 mm copper 202, 0.6 mm copper 204, 0.9 mm copper 206, 1.27 mm copper 208, 0.5 mm aluminium 212, 0.6 mm aluminium 214, 0.7 mm aluminium 216, and 0.8 mm aluminium 218.

Whilst cable inventory records may exist, as described above, such data can be incorrect. Examples of the invention utilises any initial data relating to the composition of the cable segments, such as cable inventory records, together with measured loss data for each circuit, to generate an updated model of the composition of the cable segments. If inventory records are not available, examples of the invention can simply utilise a predicted composition, and still be able to generate an updated model of the composition of the cable segments. Examples of the invention will now be described with reference to the flow chart of FIG. 3.

Figure 3:
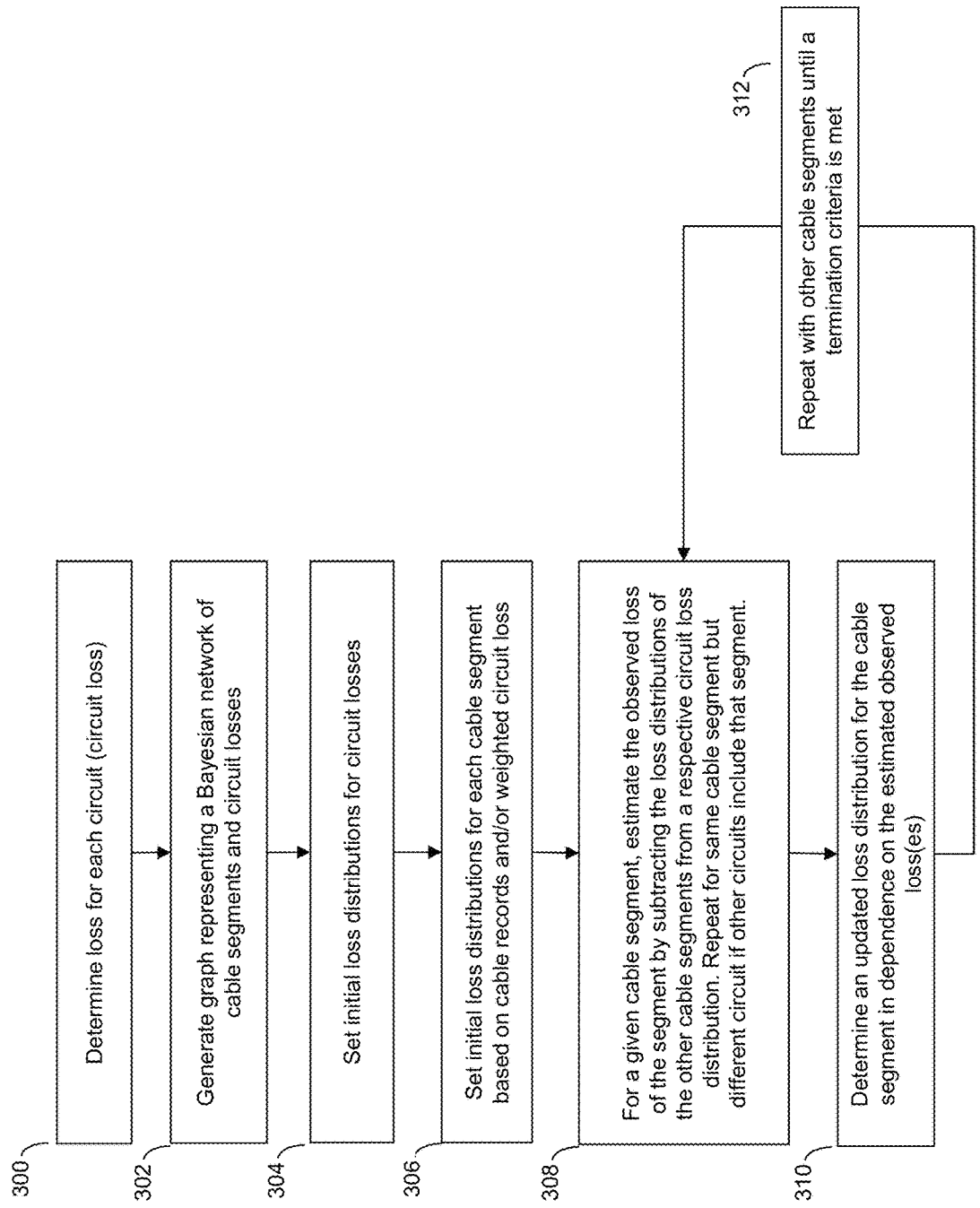
FIG. 3 is a flow chart illustrating the steps of an example of the invention.

The flow chart of FIG. 3 describes the method, which may be implemented by the estimation module 120 shown in FIG. 1. The estimation unit 120 is connected to the DSLAM 102, and comprises a processor and memory. The estimation module 120 may be located at the same location as the DSLAM 102, or may be located elsewhere in the network such as in network server.

In FIG. 2, step 200, the estimation module 120 first determines the loss associated with each circuit. The loss for the circuit to customer premises 108 is given by $L_1$. The loss for the circuit to customer premises 106 is given by $L_2$. H log loss measurements at 300 kHz are used, which can be obtained from the DSLAM 102.

Figure 4:
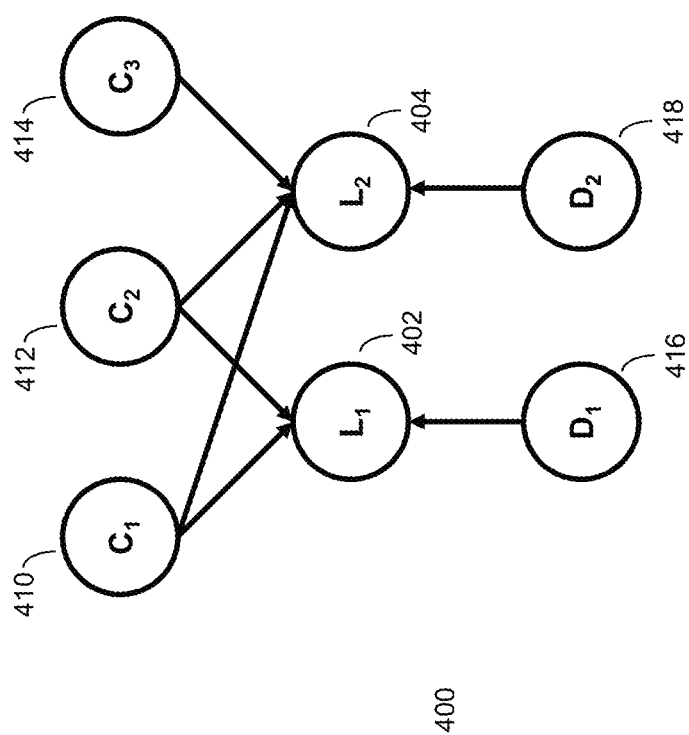
FIG. 4 is a graph representing a Bayesian network in an example of the invention.
Figure 6A:
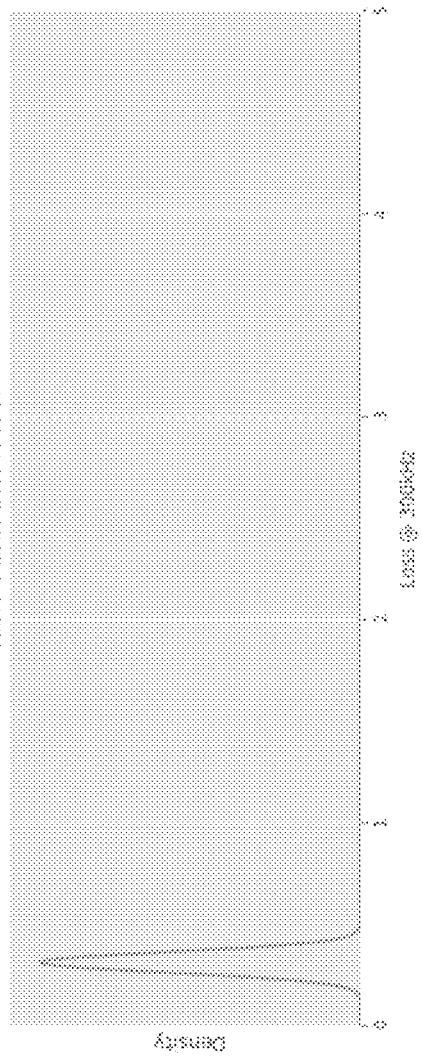
FIGS. 6a, 6b, 6c, 6d and 6e show initial loss distributions for cable segments.
Figure 6B:
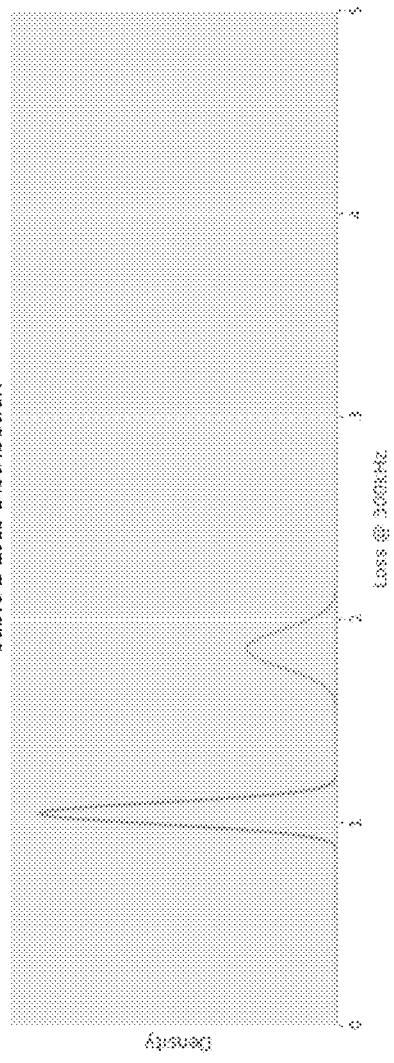
Figure 6C:
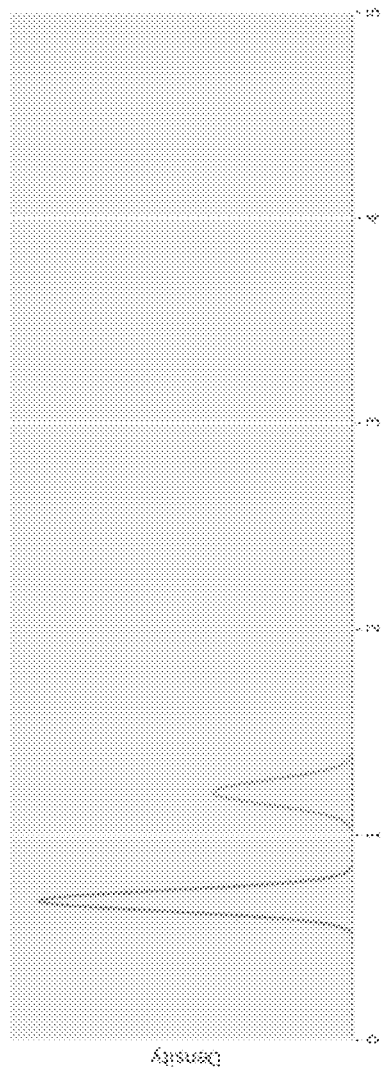
Figure 6D:
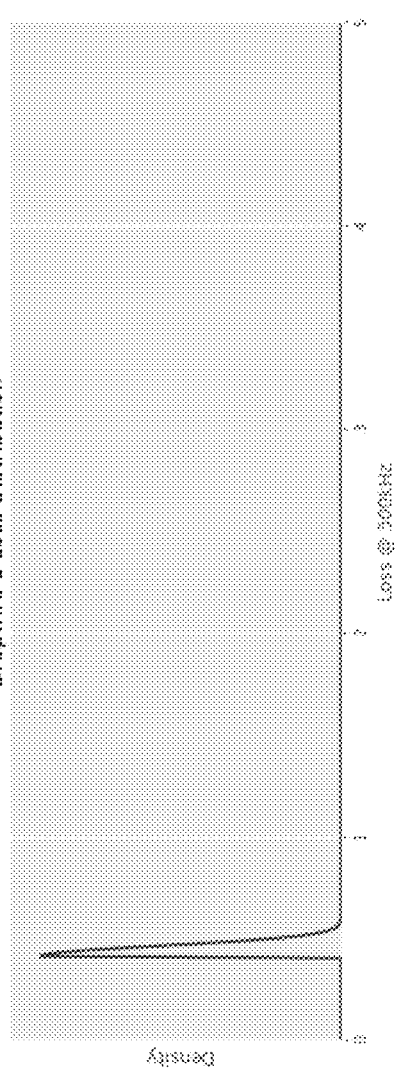
Figure 6E:
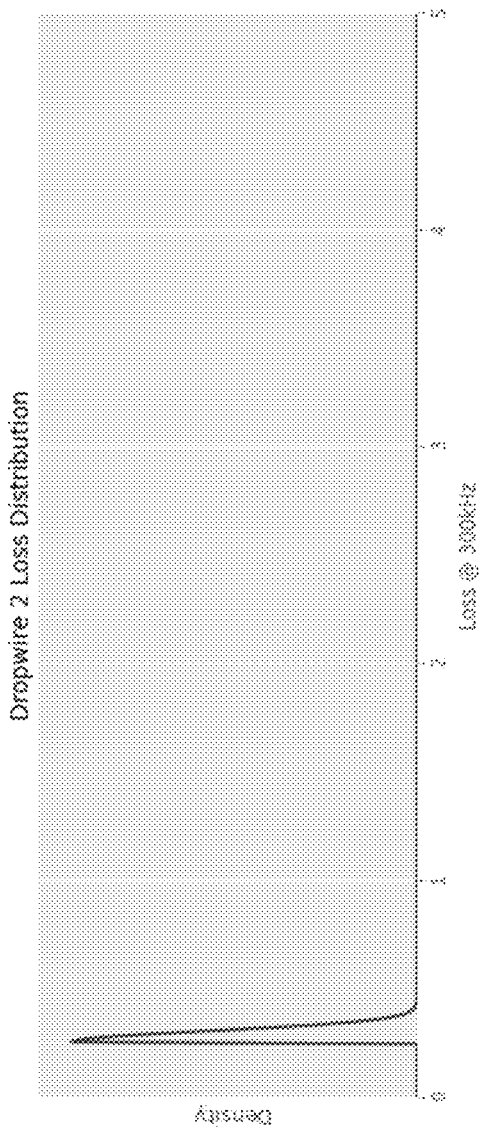

In step 302, the estimation module 120 can generate a graph representing a Bayesian network of cable segment losses and circuit losses. FIG. 4 shows an example of such a graph 400. Here, the loss $L_1$ is represented by node 402 and loss $L_2$ represented by nodes 404. The loss for cable segment $C_1$ is represented by node 410, the loss for cable segment $C_2$ is represented by node 412, the loss for cable segment $C_3$ is represented by node 414, the loss for cable segment $D_1$ is represented by node 416, and the loss for cable segment $D_2$ is represented by node 418. Furthermore, links between the nodes show how one node is influenced by another. Here, node $L_1$ 402 has links to node $C_1$ 410, node $C_2$ 412, and node $D_1$ 416. Similarly, node $L_2$ 402 has links to node $C_1$ 410, node $C_2$ 412, node $C_3$ 414, and node $D_2$ 418.

In step 304, the estimation module 120 sets initial loss distributions for each of the circuit losses $L_1$ and $L_2$. The circuit losses as described earlier are taken from H log measurements in step 200 from each circuit. However to reflect that the loss data is only provided to a resolution of 0.1 dB, the small degree of uncertainty in this measurement can be represented by modelling the losses using Gaussian distributions with a standard deviation of 0.1. FIG. 5a shows the initial circuit loss distribution for $L_1$ based on a measured H log loss measurement of 1.88 dB at 300 kHz. FIG. 5b shows the initial circuit loss distribution for $L_2$ based on a measured H log loss measurement of 2.75 dB at 300 kHz.

In step 306, the estimation module 120 sets initial loss distributions for each of the cable segments $C_1$, $C_2$, $C_3$, $D_1$ and $D_2$. These initial loss distributions can be derived from cable inventory records.

Cable inventory records are typically stored in a database, and record the assumed composition of each cable segment in a network. As discussed earlier, these records may be flawed. Nonetheless, any available cable inventor record data can provide a useful starting point for the invention. Specifically, the composition of a given cable segment can be used to generate initial loss distributions for the cable segment. Reference is made to FIG. 2 described earlier, which shows example loss distributions based on the composition (material, length and gauge) of a cable segment. However, to simplify this example, the cable compositions are limited to the material, Cu or Al. As seen earlier in FIG. 2, consideration of gauge and length results in different loss distributions, but the method applied remains the same.

The initial loss distributions are set of all the cable segments accordingly.

FIGS. 6a, 6b, 6c, 6d and 6e show the initial loss distributions for cable segments $C_1$, $C_2$, $C_3$, $D_1$ and $D_2$ respectively. In this example, cable inventory records exist, and the initial loss distributions are based on these records. Note, the loss distribution for $C_1$ shown in FIG. 6a has a single peak as the cable segment is identified with a starting probability of 1.0 copper. This initial probability is sometimes referred to the prior, and represented as Prior={Cu: 1.0, Al 0.0}. In contrast, $C_2$ shown in FIG. 6b has two peaks as a result of the cable segment being identified with a starting probability of 0.65 copper and 0.35 aluminium (Prior: {Cu: 0.65, Al 0.35}). Similarly, cable segment $C_3$ has a prior of {Cu: 0.65, Al 0.35}.

However, if cable inventory records are not available, then the initial loss distributions for segments within a given circuit can be set to proportions of the circuit loss distribution based on an assumed cable segment length. Thus, each cable segment initial loss distribution is a weighted average of the circuit loss distribution. Other methods can be used to set the initial loss distributions as well, such as assuming all segments in a circuit are made of a certain gauge of copper, and setting associated lengths such that the total of the initial loss distributions equals that of the circuit loss distribution.

In step 308, the estimation unit 120 performs Bayesian updates of each cable segment's loss distribution using Gibbs sampling, where the other cable segments' loss distributions are fixed whilst the distribution of the segment under consideration is updated. This is illustrated as follows.

With reference to the Bayesian network graph in FIG. 4, circuit loss $L_1$ can be attributed to the cable segments $C_1$, $C_2$ and $D_1$. In effect, the loss distribution for $L_1$ should equal the sum of the loss distributions for $C_1$, $C_2$ and $D_1$. Whilst the loss distribution for $L_1$ can be considered to be relatively accurate, the loss distributions for the cable segments $C_1$, $C_2$ and $D_1$ may be erroneous due to flawed cable inventory records as discussed earlier, or incorrect weighted averages. The method aims to determine updated loss distributions, which provide more accurate estimates of the cable segments' compositions.

An observed loss distribution for a given cable segment in a circuit is estimated by subtracting the loss distributions of the other cable segments from the respective circuit loss distribution. The observed loss distribution for that segment can then be used to update the initial loss distribution for that cable segment to generate (step 310) an updated loss distribution. This is performed for the remaining cable segments in the network. And then the whole process repeated a number of times for each cable segment until some termination criteria is met (step 312), for example when the difference between successive update loss distributions for the cable segments reaches some (low) threshold.

Using the circuit loss $L_1$ and cable segments $C_1$, $C_2$ and $D_1$ as an example, step 308 is illustrated as follows.

The observed loss distribution ($C'_2$) for cable segment $C_2$ can be estimated as the initial loss distribution of the circuit $L_1$ minus the initial loss distribution of segments $C_1$ and $D_1$:

$$C'_2 = L_1 - D_1 - C_1$$

The resulting observed loss distribution can be represented as (or mapped onto) a weighted probability of the cable composition (loss weight) e.g. a weighted probability might be Cu 0.85, Al 0.15. This can be done by comparing the observed loss distribution to each of the cable composition distributions, and determining the probability of any given cable composition distribution contributing to the observed loss distribution.

If the cable segment being processed forms part of other circuits, then the same estimate can be performed with the respective other circuits and their associated cable segments. For example, here cable segment $C_2$ also forms part of circuit loss $L_2$, the observed loss distribution ($C''_2$) for cable segment $C_2$ can also be estimated as the initial loss distribution of the circuit $L_2$ minus the initial loss distribution of segments $C_1$, $C_3$, and $D_1$:

$$C''_2 = L_2 - D_2 - C_1 - C_3$$

And like for $C'_2$, the resulting observed loss distribution $C''_2$ can be represented (or mapped onto) as a weighted probability of the cable composition e.g. Cu 0.80, Al 0.20.

In step 310, the observed loss distributions, in this example $C'_2$ and $C''_2$, are used to update the current loss estimate (initially the initial loss distribution) for that cable segment, here $C_2$. This can be done in a number of ways. In one approach, the weighted probabilities for the observed loss distributions for the cable segment can be added to the prior (initial) weights, to generate a posterior weight for that segment. The posterior weight can be normalised to generate an updated weight, so that the individual weights total 1, and thus represent a probability distribution. This probability distribution thus effectively provides a map of the observed loss distribution onto cable composition probability. This updated weight provides a more accurate estimate of the cable composition of a segment based on observed circuit loss and any updated estimates from other cable segments.

Turning back to the example of cable segment $C_2$, the prior weight=Cu 0.65, Al 0.35. Loss weights $C'_2$=Cu 0.85, Al 0.15, and $C''_2$=Cu 0.80, Al 0.20. Then the posterior weight=Cu 2.3, Al 0.7, which when normalised results in an updated weight for $C_2$=Cu 0.7667, Al 0.2333.

The updated weight can be substituted back into the calculations for other cable segments in step 312, where steps 308 and 310 are repeated for other cable segments, but with the initial loss distributions (weights) for any previously cable segments set to the updated weight.

Step 312 can be repeated until all the cable segments have been processed at least once, and up to any number of times with updated weights, until some termination criteria is met. For example, once the difference between successive updated weights each cable segment is less than some threshold, then further iterations of step 312 are not required i.e. the updated estimates have reached or is reaching a sufficiently stable state.

In a modification to the above method, step 308 preferably starts with a cable segment that is estimated to be the longest. Thus the cable segment that is likely to have the greatest impact on a circuit (the longest cable), is updated first, and Examples of the invention are realised, at least in part, by executable computer program code which may be embodied in an application program data. When such computer program code is loaded into the memory of a processor in the control module xxx, it provides a computer program code structure which is capable of performing at least part of the methods in accordance with the above described exemplary embodiments of the invention.

A person skilled in the art will appreciate that the computer program structure referred can correspond to the flow chart shown in FIG. 2, where each step of the flow chart can correspond to at least one line of computer program code and that such, in combination with the processor in the estimation module 120, provides apparatus for effecting the described process.

In general, it is noted herein that while the above describes examples of the invention, there are several variations and modifications which may be made to the described examples without departing from the scope of the present invention as defined in the appended claims. One skilled in the art will recognise modifications to the described examples.

The invention claimed is:

1. A method of modelling the composition of cable segments in a network, said network comprising a plurality of circuits each connected to a respective customer premises, each circuit comprising at least one cable segment and at least one cable segment is shared between a plurality of circuits, said method comprising:
   a) determining a loss measurement for each circuit;
   b) setting a circuit loss distribution for each circuit in dependence on the loss measurement for the respective circuit;
   c) setting a loss distribution for each cable segment to a respective initial loss distribution;
   for a selected cable segment:
   d) estimating an observed loss of the selected cable segment by subtracting, from the circuit loss distribution of a circuit comprising the selected cable segment, the loss distributions of any other cable segments in said circuit;
   e) repeating step d) for other circuits comprising the selected cable segment to estimate further observed losses;
   f) determining an updated loss distribution for the selected cable segment in dependence on the observed loss estimates from steps d) and e), and setting the loss distribution for the selected cable segment to the updated loss distribution;
   g) repeating step d) to f) for other selected cable segments; and
   h) mapping the loss distributions for each cable segment onto respective cable composition probabilities.

2. A method according to claim 1, wherein steps d) to f) are performed using Gibbs sampling.

3. A method according to claim 1, wherein steps d) to g) are repeated until a predetermined termination criteria is met.

4. A method according to claim 1, wherein the cable segments are metallic.

5. A method according to claim 1, wherein the composition comprises at least one of material, gauge or length.

6. A method according to claim 1, wherein the respective initial loss distributions are based on an initial prediction of the cable segment composition.

7. A method according to claim 6, wherein the initial prediction is based on cable inventory records.

8. A method according to claim 6, wherein the initial prediction is based on a weighted circuit loss distribution.

9. A method according to claim 1, wherein the loss distributions are probability distributions of the loss.

10. A method according to claim 1, wherein the updated loss distribution for a cable segment is dependent on the estimated observed loss distribution and the initial loss distribution of that cable segment.

11. A non-transitory computer-readable storage medium storing a computer program or suite of computer programs which upon execution by a processor performs the method of claim 1.

12. A method according to claim 1, wherein:
   a cable composition comprises length, gauge and material of a cable;
   mapping the loss distribution for each selected cable segment onto respective cable composition probabilities includes comparing the observed loss distribution to each of a plurality of cable composition distributions and determining a probability of any given cable composition distribution contributing to the observed loss distribution;
   the method further comprises using the cable composition probabilities to determine a speed of a broadband service that can be received over each circuit; and
   each respective initial signal loss distribution is set to a proportion of a circuit loss probability distribution based on a weighted average of the circuit loss probability distribution.

13. An estimation unit for modelling the composition of cable segments in a network, said network comprising a plurality of circuits each connected to a respective customer premises, each circuit comprising at least one cable segment and at least one cable segment is shared between a plurality of circuits, said estimation unit adapted to:
   a) determine a loss measurement for each circuit;
   b) set a circuit loss distribution for each circuit in dependence on the loss measurement for the respective circuit;
   c) set a loss distribution for each cable segment to a respective initial loss distribution;
   for a selected cable segment:
   d) estimate an observed loss of the selected cable segment by subtracting, from the circuit loss distribution of a circuit comprising the selected cable segment, the loss distributions of any other cable segments in said circuit;

e) repeat step d) for other circuits comprising the selected cable segment to estimate further observed losses;

f) determining an updated loss distribution for the selected cable segment in dependence on the observed loss estimates from steps d) and e), and setting the loss distribution for the selected cable segment to the updated loss distribution;

g) repeat step d) to f) for other selected cable segments; and map the loss distributions for each cable segment onto respective cable composition probabilities.

14. An estimation unit according to claim 13, wherein:

a cable composition comprises length, gauge and material of a cable;

the estimation unit is further adapted to:
- map the loss distribution for each selected cable segment onto respective cable composition probabilities by comparing the observed loss distribution to each of a plurality of cable composition distributions and determining a probability of any given cable composition distribution contributing to the observed loss distribution; and
- use the cable composition probabilities to determine a speed of a broadband service that can be received over each circuit; and each respective initial signal loss distribution is set to a proportion of a circuit loss probability distribution based on a weighted average of the circuit loss probability distribution.

* * * * *